United States Patent [19]

Shintock

[11] 4,214,972
[45] Jul. 29, 1980

[54] SHEET HANDLING APPARATUS

[75] Inventor: Eugene Shintock, Allen Park, Mich.

[73] Assignee: Shatterproof Glass Corporation, Detroit, Mich.

[21] Appl. No.: 925,939

[22] Filed: Jul. 19, 1978

Related U.S. Application Data

[63] Continuation of Ser. No. 822,736, Aug. 8, 1977, abandoned, which is a continuation of Ser. No. 674,911, Apr. 8, 1976, abandoned.

[51] Int. Cl.² .............................................. C23C 15/00
[52] U.S. Cl. .................................. 204/298; 118/729; 118/70; 198/472
[58] Field of Search ............... 198/422, 472, 494, 457, 198/496, 600, 648, 726, 860, 861; 15/308; 118/70, 729; 65/27, 168; 156/389; 427/38, 445; 204/192, 298; 271/9, 184, 225; 270/58

[56] References Cited

U.S. PATENT DOCUMENTS

| | | | |
|---|---|---|---|
| 2,523,025 | 9/1950 | Jeppson et al. | 198/472 |
| 3,150,614 | 9/1964 | Scarpa | 198/422 |
| 3,221,754 | 12/1965 | Robson et al. | 198/472 |
| 3,288,269 | 11/1966 | Roth et al. | 198/422 |
| 3,479,852 | 11/1969 | Conrad et al. | 15/308 |
| 3,758,913 | 9/1973 | Elliott et al. | 15/308 |
| 3,945,903 | 3/1976 | Svendor et al. | 204/192 OP |
| 3,968,018 | 7/1974 | Lane et al. | 204/192 EC |

OTHER PUBLICATIONS

Western Electric Technical Dig. No. 19, 7' 1970, "Method of Improving the Quality on In-Line Sputtered Thin Films by Sonic Vacuuming", p. 3.

Primary Examiner—Joseph E. Valenza
Attorney, Agent, or Firm—William E. Nobbe

[57] ABSTRACT

Sheet handling apparatus in which sheets or plates of glass are automatically loaded onto the upper surfaces of successive horizontal support platens as the glass sheets and platens are conveyed forwardly in different horizontal planes preparatory to the introduction of the loaded platens into a processing apparatus. The loading apparatus also contemplates the provision of means for removing dust, dirt and other contaminates from the support platens prior to the loading of the glass sheets thereon and means for maintaining the upper surfaces of the glass sheets free of foreign matter during the loading of them onto the support platens and the transfer of the support platens into the processing apparatus.

1 Claim, 11 Drawing Figures

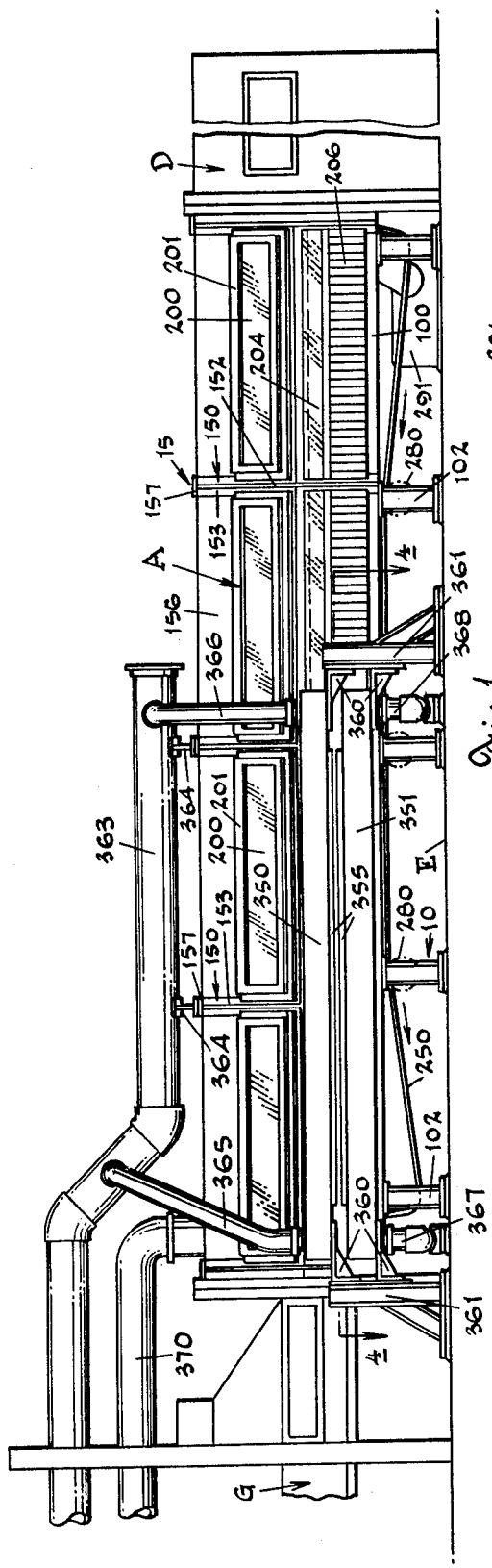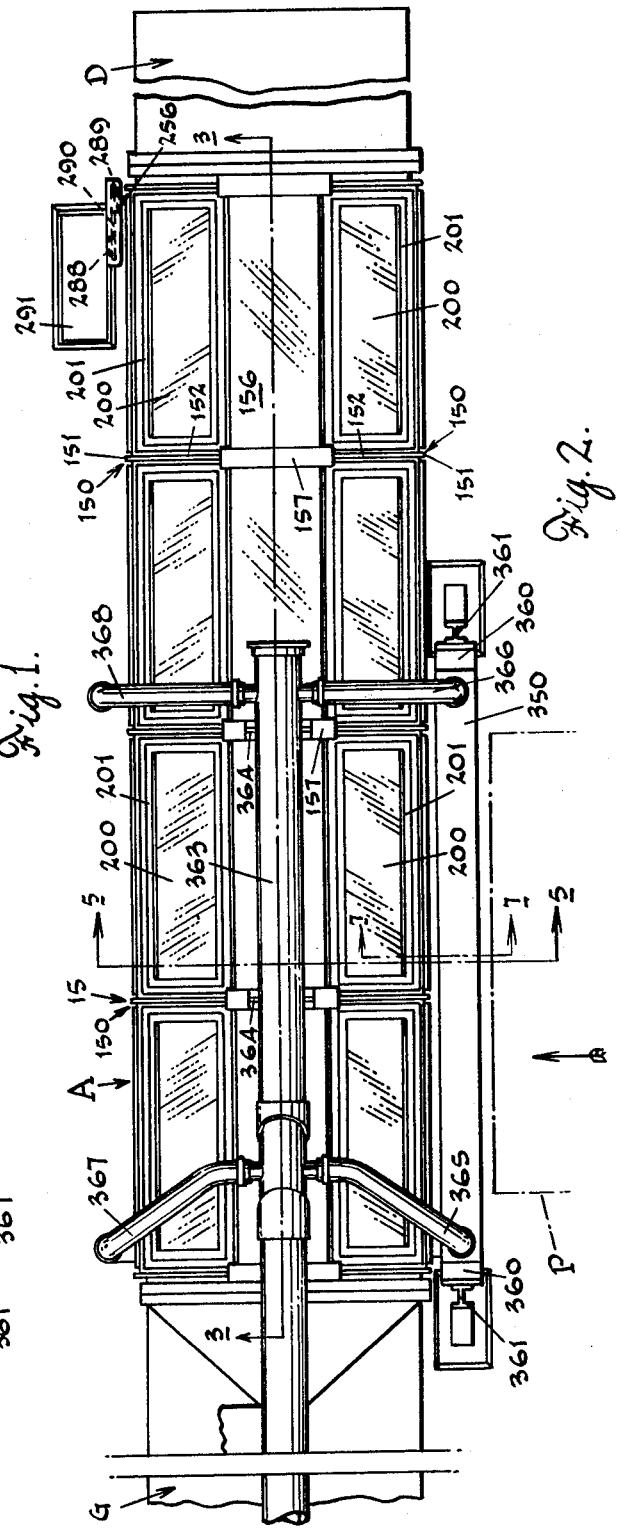

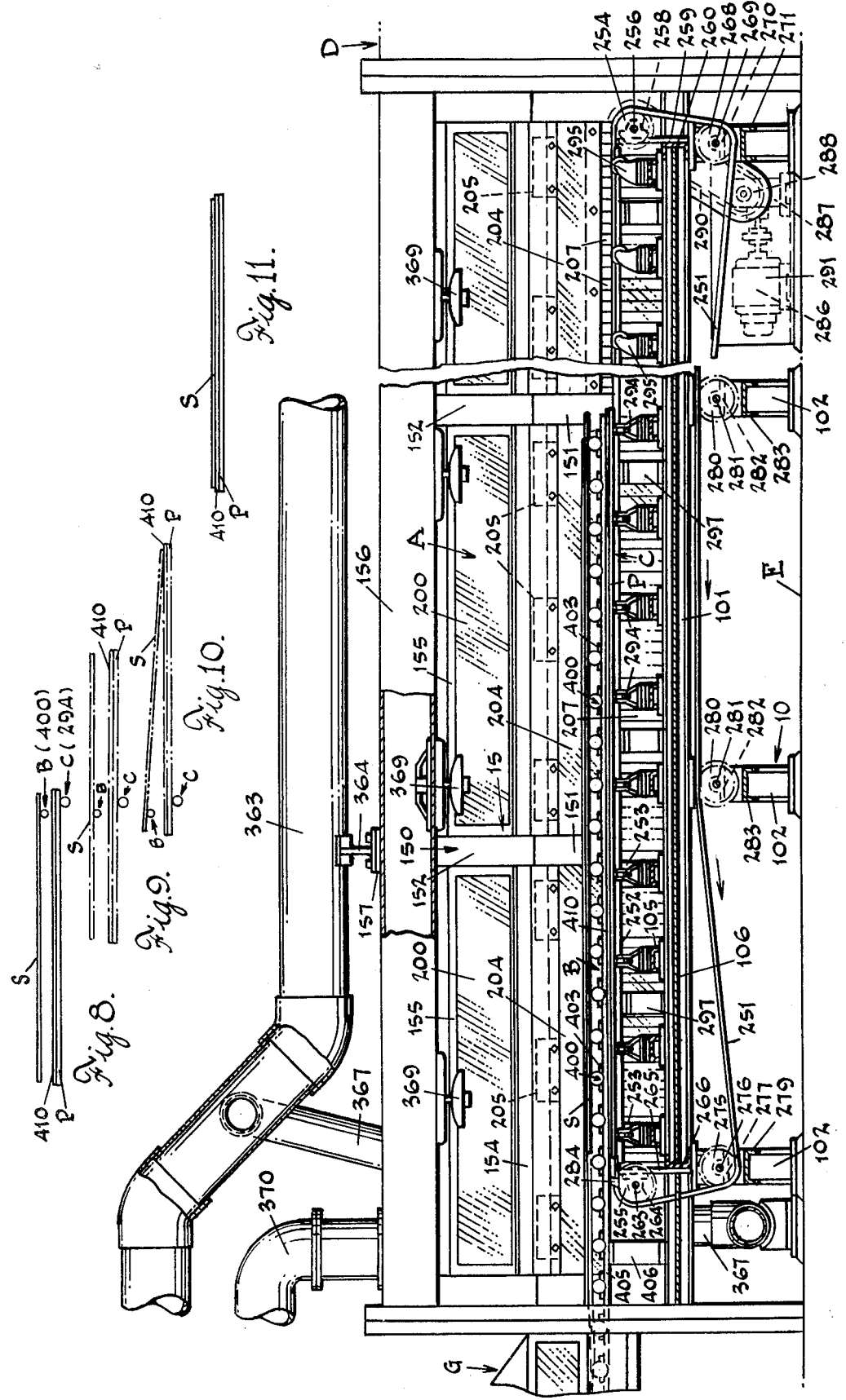

SHEET HANDLING APPARATUS

This is a continuation of application Ser. No. 822,736, filed Aug. 8, 1977, now abandoned, which is a continuation of application Ser. No. 674,911, filed Apr. 8, 1976, now abandoned.

BACKGROUND OF THE INVENTION

The present invention relates to sheet handling apparatus and more particularly to apparatus for loading sheets or plates of glass, or other materials, onto a moving support means for further processing.

While not limited in its use, the apparatus of this invention is of special utility when employed in conjunction with apparatus for the continuous sputter-coating of thin films of metal or a metal alloy upon the surface of glass sheets or other substrates. Sputter-coating involves ion bombarding a target of the coating material in low-pressure gaseous glow discharge to cause particles of the coating material to be dislodged and deposited on the upper surfaces of the substrates to form a continuous film thereon.

One type of coating apparatus for carrying out such a process is disclosed in U.S. Pat. No. 3,904,506, dated Sept. 9, 1975, and embodies a plurality of aligned, independently controlled contiguous chambers including an entry chamber, a coating chamber and an exit chamber, sputter-coating means in the form of a substantially rectangular cathode mounted horizontally in the upper portion of the coating chamber and having a sheet of a selected coating material secured to the bottom thereof, and conveyor means for moving the substrates (glass sheets) in a horizontally disposed position through the successive chambers and beneath the sputter-coating means.

As disclosed in the above patent, the glass sheets or other substrates to be coated are horizontally supported upon and in contact with the upper surfaces of substantially rigid metal platens which convey the glass sheets through the successive chambers of the coating apparatus. While this has proven commercially acceptable, it has been found that, in certain instances, significant improvement can be obtained in the thickness and composition of the coating, as well as the color of the glass sheet at the edges thereof, by overlaying the upper surface of the metal platen with one or more plates of glass and then laying the glass sheets to be coated on the glass overlay and out of contact with the metal platen.

The present invention comprehends the provision of new and improved apparatus for loading the glass sheets to be coated on the support platens in direct contact therewith (or on the glass overlay for the platen, if an overlay is being used). More particularly, the loading apparatus embodies means for automatically depositing glass sheets to be coated horizontally upon successive platens as the said platens and glass sheets are conveyed forwardly in different horizontal planes and preparatory to their being delivered to the coating apparatus.

It has been found that in such a sputter-coating operation, the metal support platens (or the glass overlay therefore) must be completely free of dust, dirt and other foreign matter when the glass sheets are placed thereon and also that the glass sheets themselves must be maintained free of all contaminates during the loading of them onto the platens and until they are introduced into the coating apparatus.

To accomplish these objectives, the loading apparatus of this invention contemplates the provision of means for effectively removing any dust, dirt and other foreign matter from both the support platen (or overlay therefore) before the glass sheets are deposited thereon and from the glass sheets during the loading of them onto the platen and their transfer into the coating apparatus.

Other objects and advantages of the invention will become apparent from the following description when taken in connection with the accompanying drawings.

BRIEF DESCRIPTION OF THE DRAWINGS

FIG. 1 is a side view of sheet handling apparatus constructed in accordance with the present invention, FIG. 2 is a top view thereof, FIG. 3 is a vertical longitudinal section taken substantially on line 3—3 of FIG. 2.

DESCRIPTION OF THE PREFERRED EMBODIMENT

The sheet handling apparatus of this invention resides in the provision of an elongated substantially rectangular housing A in which are located the upper and lower conveyor means B and C respectively which extend longitudinally thereof, said conveyors being arranged in different horizontal planes, with a portion of the lower conveyor extending forwardly beyond the upper conveyor as shown in FIG. 3. Generally stated, the lower conveyor C is adapted to receive a planular support member or metal platen P which is introduced laterally into the housing at one side thereof as will be more fully hereinafter described. After being received within the housing, the platen is advanced forwardly in timed relation to the forward movement of a glass sheet S carried by the upper conveyor B.

When the glass sheet, in its forward movement, reaches the forward end of the upper conveyor, it is halted preparatory to being transferred onto the platen. The glass sheet and platen are then simultaneously advanced on their respective conveyors, one above the other, until the major portion of the leading end of the glass sheet eventually becomes overbalanced whereupon the said leading end descends or drops onto the leading end of the platen. Then, upon continued movement, as the trailing end of the glass sheet leaves the forward end of the upper conveyor, the sheet will drop onto the trailing end of the platen.

When the glass sheet S is fully received on the platen P continued operation of the lower conveyor C will move the loaded platen forwardly from the loading apparatus into the entrance end of a further processing apparatus or facility D, wherein the glass sheet is to be subjected to a desired treatment, such as by sputter-coating a thin film of metal or a metal alloy upon the upper surface thereof.

Figure 5:
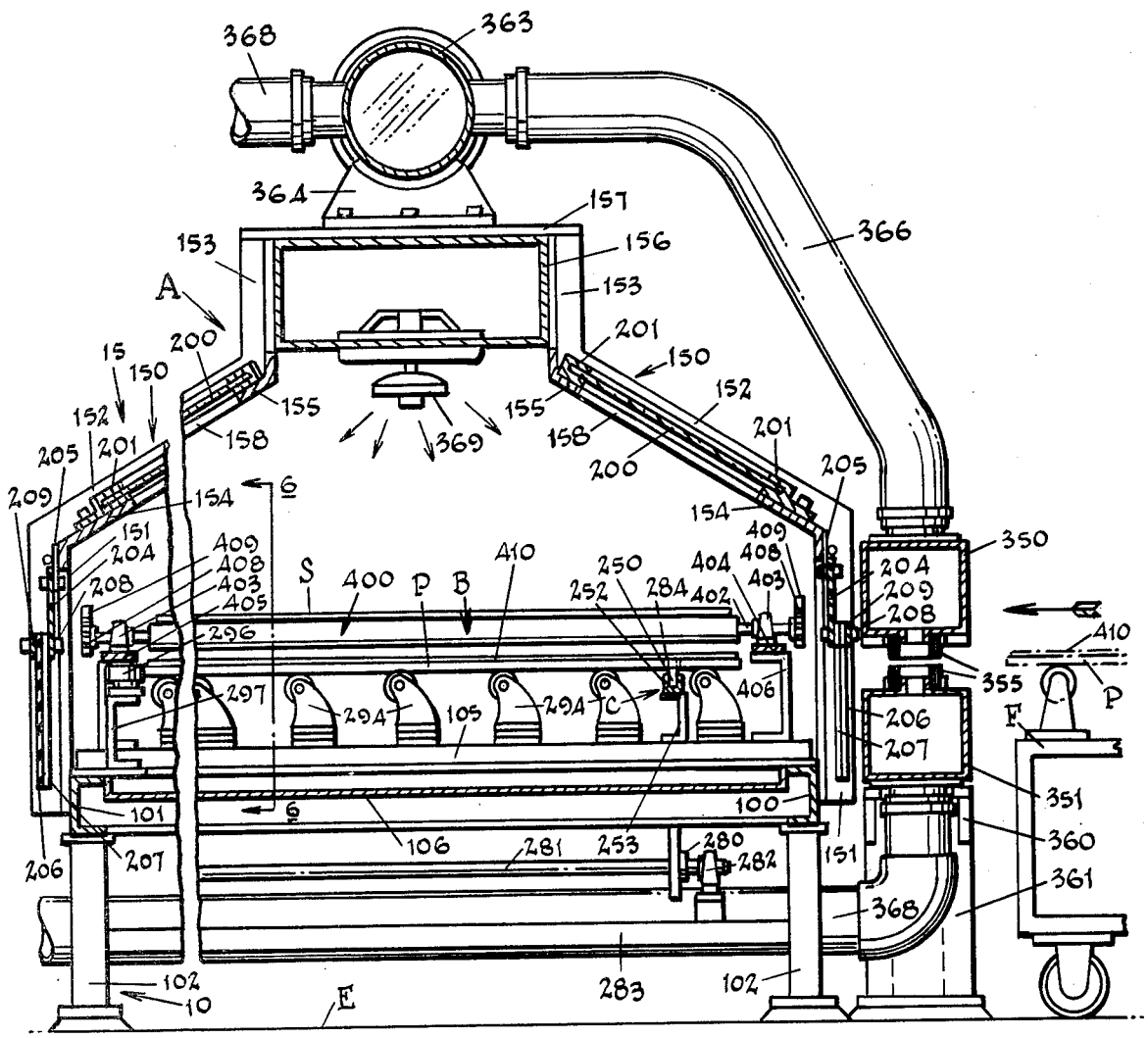
FIG. 5 is an enlarged vertical transverse section taken substantially on line 5—5 of FIG. 2.

The housing A containing the upper and lower conveyors B and C is, as viewed in FIGS. 3 and 5, supported on a framework generally designated by the numeral 10. The base of the framework is constructed of longitudinal, horizontally disposed parallel side beams 100 and 101 supported between their respective ends on pedestals 102 located at regularly spaced intervals from one another and mounted on the floor E. The side beams 100 and 101 are joined by a plurality of spaced transverse channel members 105 secured to the upper surfaces of the said beams. An elongated rectangular pan 106 is mounted on the side beams 100 and 101 beneath the channel members 105 to form a bottom for the housing and close off the lower area therebeneath.

The framework 10 mounts a superstructure 15 which forms the support for the housing A. This superstructure comprises a plurality of longitudinally spaced substantially vertical Z-shaped T-bars 150 carried by the side beams 100 and 101. It will be noted in FIG. 5 that both sides of the superstructure are identical so that the same reference numerals will be employed to designate like parts. The vertical base elements 151 of the T-bars 150 are turned inwardly at their upper ends to provide the inwardly and upwardly inclined intermediate sections 152 which terminate in vertically directed upper sections 153. The base elements 151 and the intermediate sections 152 are connected at their adjacent ends by horizontal bars 154, while the intermediate sections 152 and upper verticcal sections 153 are connected by horizontal bars 155. The upper sections 153 are attached to and support therebetween a longitudinally extending duct 156 and are joined thereabove by transverse bars 157. The duct 156 is rectangular in cross section and forms the top of the housing A.

The housing A also includes a plurality of transparent panels 200 of glass or plastic material which provide windows through which the interior of the housing can be readily observed. The window panels 200 are contained in frames 201 that are supported on and secured to the flanges 158 of the inclined intermediate sections 152 and the bars 154 and 155. Similar transparent window panels 204 are supported by hinges 205 on the bars 154. The window panels 200 and 204, and the superstructure 15, make up the side walls of the housing.

Depending from the lower edges of the window panels 204 at opposite sides of the housing are a plurality of relatively narrow flexible strips 206 and 207 of rubber or other suitable material which are clamped by bolts 208 between each of the panels 204 and bars 209. The flexible strips 206 and 207 are arranged in overlapping relation to one another to substantially close the lower area of the housing along the outer sides of the beams 100 and 101. In the area through which the platens P are introduced into the housing the strips 206 and 207 are omitted as shown in FIG. 5 so as not to interfer with movement of the platens into said housing.

The lower conveyor C comprises a pair of longitudinally extending sprocket chains 250 and 251 adjacent opposite sides of the housing (FIG. 4) and which, in their upper flights traverse tracks 252 mounted by brackets 253 on the channel members 105. The upper flights of the chains 250 and 251 are trained about sprocket gears 254 and 255 located at opposite ends of the tracks 252. The sprocket gears 254 are fixed on a transverse shaft 256 journaled at its opposite ends in bearings 258. These bearings are mounted on vertical plates 259 supported on a horizontal transverse beam 260 secured at its ends to the horizontal side beams 100 and 101. In like manner, the sprocket gears 255 at the opposite end of the tracks 252 are keyed to a transverse shaft 263 journaled at its opposite ends in bearings 264, said bearings being also mounted on vertical plates 265 supported on a horizontal transverse beam 266 secured at its opposite ends to said side beams 100 and 101.

Upon entering their return flights, the chains 250 and 251 are directed downwardly from the gears 254 and trained about idler sprocket gears 268 on a transverse shaft 269 journaled at its opposite ends in bearings 270 mounted on a transverse beam 271 supported at its ends on opposed pedestals. The sprocket chains 250 and 251 are directed upwardly into their upper flights about sprocket gears 275 fixed to a transverse shaft 276 journaled at its ends in bearings 277 mounted on a beam 279 supported at its ends by opposed pedestals 102. Between the sprocket gears 268 and 275 the lower flight of the sprocket chains 250 and 251 are supported by several idler gears 280 fixed on individual transverse shafts 281 journaled in bearings 282 supported on transverse beams 283 mounted at their ends on opposed pedestals 102.

Each of the sprocket chains 250 and 251 carries a number of lugs 284 appropriately spaced to engage the trailing edges of at least two successive platens P to move them forwardly as the said chains are driven. Operative movement of the chains 250 and 251 in the direction indicated by the arrows in FIG. 3 is provided from a suitable source of power including a drive motor 286 and a reduction gear unit 287. The output shaft of the gear reduction unit mounts a sprocket gear 288 which drives a procket gear 289 keyed to a shaft 256 through a sprocket chain 290. A suitable enclosure 291 can be provided for the motor 286, gear reduction unit 287, sprocket gears 288 and 289 and the sprocket chain 290 trained thereabout.

The support platen P, which is moved forwardly within the housing by the lugs 284 on sprocket chains 250 and 251, is aupported by means of the two groups of swivel-type caster units 294 and 295 mounted on the transverse channel members 105. The caster units are arranged in a plurality of longitudinal and transverse rows. The platen which is to receive the glass sheet thereon is introduced into the housing A froma cart F (FIG. 5) or other suitable means through a horizontal elongated opening or slot at one side of the housing adjacent the entrance end thereof and moved laterally until it is received on the casters 294. To ensure that the platen is properly positioned in centered alignment on the lower conveyor C horizontal edge rollers 296 are located at spaced intervals along the opposite or far side of said conveyor, said edge rollers being supported by brackets 297 on the side beam 101. The platen is moved laterally over the casters 294 until it engages the edge rollers 296.

Figure 4:
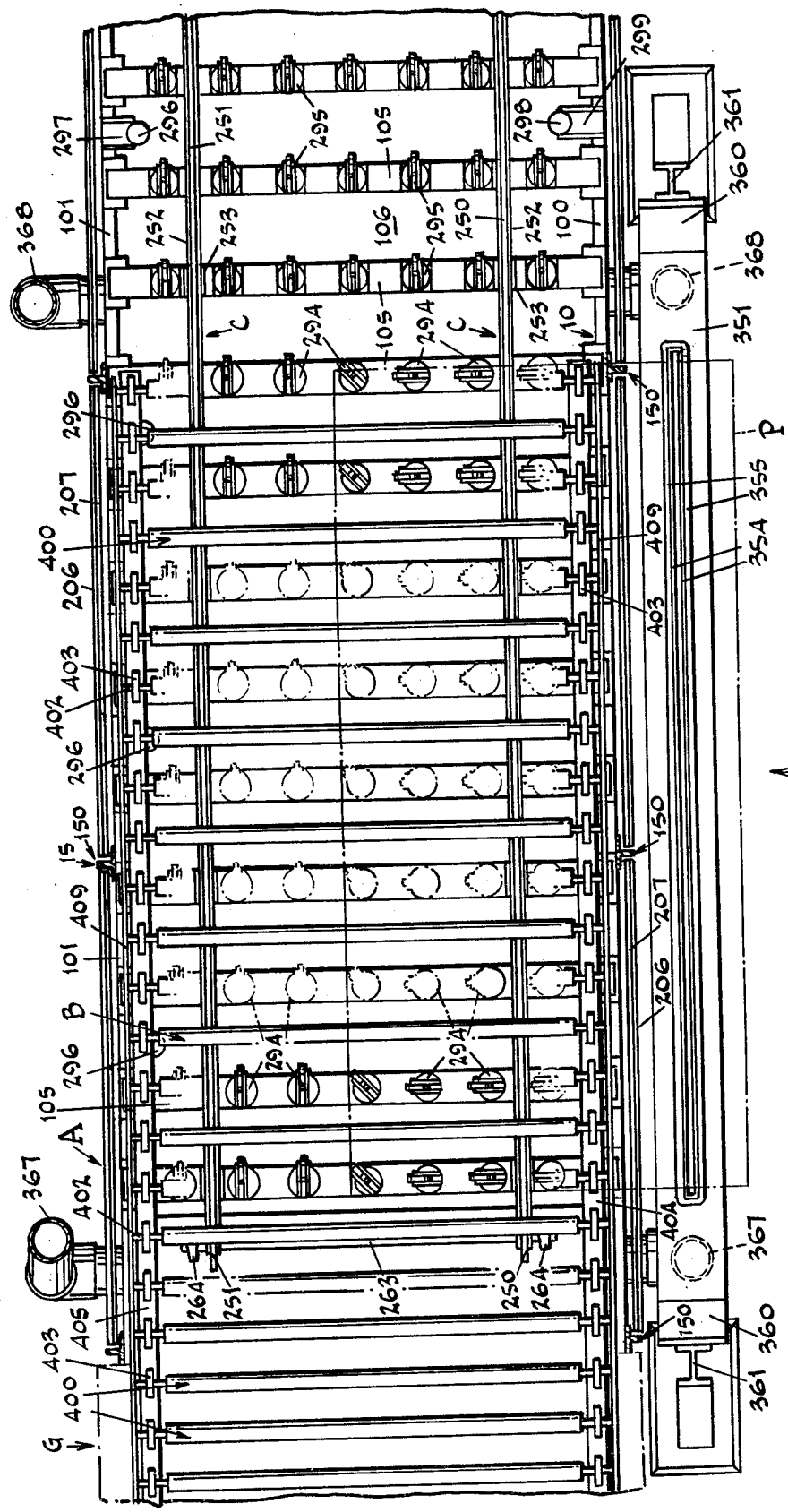
FIG. 4 is a horizontal longitudinal section taken substantially on line 4—4 of FIG. 1.

As shown in FIG. 4, additional edge rollers 296 are mounted at spaced intervals on the side beam 101 opposite the casters 295. A series of edge rollers 298 may also be located opposite the casters 295 forwardly of the horizontal slot in the side of the housing A, said edge rollers being supported by brackets 299 on the side beam 100. As the platen is advanced by the chains 250 and 251, it will be maintained in centered relation with respect to the longitudinal axis of the conveyor C as well as to the entrance end of the processing apparatus D which is adapted to receive the loaded platen from the loading apparatus.

When the chains 250 and 251 are driven the forward movement of the platen causes the rollers of the caster units 294 to swing into longitudinal alignment with the rollers of the caster units 295. On the other hand, as the next platen is moved laterally into the housing the rolls of the caster units 294 will be swung from positions of longitudinal alignment into positions of transverse alignment (FIG. 4) and then, as the platen is moved forwardly by the lugs 284 on chains 250 and 251 the rollers of the caster units 294 will again be turned into longitudinal alignment with the rollers of the caster units 295.

As brought out above, the loading apparatus of this invention is particularly adapted for use in conjunction with a continuous type of sputter-coating apparatus such as that disclosed, for example, in U.S. Pat. No. 3,904,506, wherein a thin film of a selected coating material is deposited on the upper surface of the glass sheet. Also that to ensure the best possible commercial results in the subsequent coating operation, it is essential that the upper surface of the support platen P be free of any dirt, dust and other contaminates when the glass sheet is placed thereon and likewise, that the interior of the housing A be maintained free of any contaminates which might settle on the upper surface of the glass sheet and present a problem in the subsequent sputter-coating operation.

Figure 7:
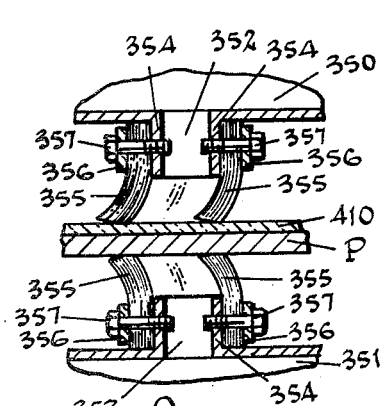
FIG. 7 is an enlarged detail section taken substantially on line 7—7 of FIG. 2, and FIGS. 8, 9, 10 and 11 are diagrammatic views illustrating the progressive sequence in the loading of a glass sheet onto a support platen.

To this end, the upper and lower surfaces of the support platen are subjected to a vacuum treatment during the entry thereof into the housing A. More particularly, as the platen moves into the housing it passes between vertically spaced elongated plenum chambers 350 and 351 (FIGS. 5 and 7). These plenum chambers are preferably rectangular in cross section and the opposed facing surfaces thereof are provided with elongated horizontal slots 352 and 353 respectively. Each slot 352 and 353 is defined by spaced continuous flanges 354 against which strips 355 of bristle-like material are clamped by bars 356 and bolts 357 (FIG. 7). The plenum chambers 350 and 351 are supported at their opposite ends by brackets 360 mounted on standards 361 (FIGS. 1 and 2) and are connected to a source of vacuum (not shown) through a main conduit 363 supported on the spaced horizontal bars 157 by brackets 364.

One end of the upper plenum chamber 350 is connected to the main conduit 363 by a pipe 365, while the opposite end thereof is connected to said conduit by a pipe 366. Similarly, the lower plenum chamber 351 is connected at one end to the main conduit 363 through a pipe 367 and at the opposite end thereof by a pipe 368. As shown in FIG. 5, the ends of pipes 366 and 368 are attached to the main conduit 363 in diametric relation to one another, which is also true of the pipes 365 and 367. It will thus be understood that as the platen P is moved between the plenum chambers 350 and 351 into the housing, the suction of the air moving across the surfaces of the platen and drawn through the slots 352 and 353 by the vacuum created in the plenum chambers will serve to remove any contaminates on the upper and lower surfaces of the platen while, at the same time, the ends of the bristles 355 will wipe the said surfaces to attain additional surface cleaning by dislodging any foreign matter which might be adhered to the platen.

At the same time, air is being introduced under pressure into the housing from the main conduit 156 through a plurality of dispersion units 369 located in the bottom thereof at regularly spaced intervals along the length of the housing. The conduit 156 is connected by a pipe 370 to a suitable blower means and a source of conditioned and filtered air (not shown). The clean air flowing into the housing passes downwardly and outwardly into the ambient atmosphere between the flexible strips 206 and 207 and the side beams 100 and 101. The pressure of the air within the housing is relatively greater than that of the ambient atmosphere so that the flow of air outwardly from the housing assures maintenance of a clean atmosphere in the housing as well as preventing undue leakage of unclean or contaminated air into said housing.

Figure 6:
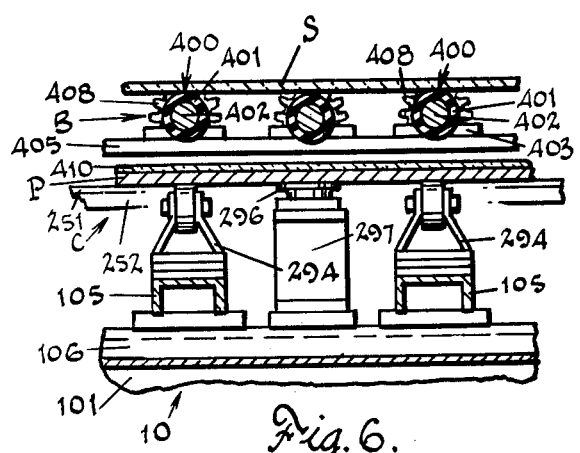
FIG. 6 is a vertical longitudinal detail section taken substantially on line 6—6 of FIG. 5.

The upper conveyor B comprises a plurality of rolls 400, each equipped with a sleeve 401 (FIG. 6) of rubber or other suitable material to protect the lower surface of the glass sheet. The sleeves 401 are fitted over transverse shafts 402 journaled at their ends in bearings 403 on platform bars 404 and 405. These bars are supported on pedestals 406 on certain of the transverse channel members 105. One or both ends of each shaft mounts a sprocket gear 408 driven from a suitable source of power by a sprocket chain 409.

OPERATION

In the operation of the apparatus, a sheet of glass S is moved into the entrance end of the housing A from a washing machine or other operating facility G and onto the upper conveyor B and advanced thereby until the leading end of the sheet reaches the end of the conveyor where it is halted. A platen P positioned on the cart F is then moved laterally into the housing between the spaced plenum chambers 250 and 251 until the far side edge thereof engages the edge rollers 296. When so positioned, the forward edge of the platen will be in substantial alignment with the forward edge of the glass sheet (FIG. 8). The platen and glass sheet are then moved simultaneously forward at the same speed as indicated in FIG. 9 until the leading end of the glass sheet passes over the last conveyor roll 400 a sufficient distance that an imbalance of the sheet is produced whereupon the leading end of the sheet will drop onto the platen adjacent the forward edge thereof, as indicated in FIG. 10. Upon continued movement of the platen and glass sheet, the rear end of the sheet will drop onto the platen and the sheet wholly received thereon as in FIG. 11.

At this time, the conveyor B can be halted or another sheet can be moved thereon into position for loading on a subsequent platen, The operation of the lower conveyor C is continued to transfer the loaded platen from the exit end of the loading apparatus into the entrance end of the sputter-coating apparatus or other operating facility D.

It will be understood that when the platen is introduced into the housing the rollers of the swivel-type caster units 294 will be disposed transverse to the longitudinal axis of the housing to receive the platen thereon. Also that after the platen has been received in the housing and is moved forwardly by the lugs 284 on the chains 250 and 251, the caster units will be automatically turned to align the rollers thereof with the rollers of the caster units 295. As the platen passes over the last row of casters 294 onto the casters 295, the near edge thereof will be engaged by the edge rollers 298 which, together with the edge rollers 296, will maintain the platen in proper position during its forward movement.

During the movement of the platen into the housing the vacuum means will be operated to create a suction across the surfaces of the platen to clean the same and during the entire movement of the glass sheet into, through and out of the housing the blower means will be operated to maintain a clean atmosphere in the housing as explained above.

As previously noted, the glass sheet may be received directly upon the upper surface of the metal platen or the upper surface of the platen may have applied thereto a glass overlay consisting of a glass plate or plurality of glass plates 410 upon which the glass sheet is supported, as disclosed in U.S. Pat. No. 3,945,903, date Mar. 23, 1976. Also that the use of such a glass overlay is usually preferred when a coating of a selected metal or metal alloy is to be deposited on the glass sheet by the sputtering process as it has been found to result in a coating of improved quality and appearance.

While the apparatus of this invention has been herein described particularly with reference to loading glass sheets onto metal support platens it can also be used for loading sheets of other materials preparatory to being further processed and therefore it is to be understood that the words used herein to describe the invention are words of description rather than of limitations and that the scope of the invention is to be limited only insofar as set forth in the appended claims.

I claim:

1. The combination with apparatus for cathodically sputtering thin films of a selected coating material from a cathode onto the upper surface of glass sheets in a coating chamber containing a low pressure ionized gas atmosphere, and a metal platen having a major upper supporting surface on which the glass sheet is freely supported horizontally in contact therewith during the coating of said glass sheet, the improvement which comprises a horizontally elongated substanially closed housing having an entrance end for receiving the glass sheets and an exit end positioned in line with and contiguous to the entrance end of said sputtering apparatus, one side wall of said housing being provided with a horizontally elongated opening through which the platens are introduced horizontally into said housing, a first conveyor means extending longitudinally within said housing for receiving the platens horizontally thereon and for delivering them through the exit end of said housing directly into the entrance end of said sputtering apparatus, means positioned exteriorly of and in close proximity to said opening in the side wall of said housing for cleaning the entire major supporting surface of said platens as said platens pass into said housing through said opening in the side wall thereof and before they are received on said conveyor means, a second conveyor means located in said housing for receiving the glass sheets to be coated horizontally thereon as they enter the entrance end thereof, said second conveyor means being located above said first conveyor means in spaced parallel relation thereto and terminating at its inner end short of the inner end of said first conveyor means, and means for driving the first and second conveyor means forwardly at substantially the same speed such that as the major portion of the leading end of the glass sheet passes beyond said second conveyor means it will drop onto the platen and when the trailing end of the glass sheet leaves the second conveyor means it will also drop onto said platen and be carried forwardly to said coating apparatus.

* * * * *